(12) United States Patent
Uchiyama

(10) Patent No.: US 6,741,315 B1
(45) Date of Patent: May 25, 2004

(54) LIQUID CRYSTAL DEVICE AND ELECTRONIC APPARATUS

(75) Inventor: Kenji Uchiyama, Hotaka-machi (JP)

(73) Assignee: Seiko Epson Corporation (JP)

( * ) Notice: Subject to any disclaimer, the term of this patent is extended or adjusted under 35 U.S.C. 154(b) by 221 days.

(21) Appl. No.: 09/644,327

(22) Filed: Aug. 23, 2000

(30) Foreign Application Priority Data

Aug. 27, 1999 (JP) .......................................... 11-241570

(51) Int. Cl.[7] .................................................. G02F 1/13
(52) U.S. Cl. .......................................... 349/149; 349/46
(58) Field of Search .................................. 349/149, 46

(56) References Cited

U.S. PATENT DOCUMENTS

| | | | |
|---|---|---|---|
| 4,826,297 A | | 5/1989 | Kubo et al. |
| 5,162,933 A | * | 11/1992 | Kakuda et al. ............... 257/55 |
| 5,334,860 A | * | 8/1994 | Naito ........................... 257/59 |
| 5,731,856 A | * | 3/1998 | Kim et al. ................... 349/147 |
| 5,847,781 A | * | 12/1998 | Ono et al. ................... 349/111 |
| 5,995,177 A | * | 11/1999 | Fujikawa et al. ........... 349/147 |
| 6,081,308 A | * | 6/2000 | Jeong et al. .................. 257/59 |
| 6,323,930 B1 | * | 11/2001 | Higuchi et al. ............. 349/152 |
| 6,424,389 B1 | * | 7/2002 | Ono et al. .................... 349/46 |
| 6,433,842 B1 | * | 8/2002 | Kaneko et al. ............... 349/46 |

FOREIGN PATENT DOCUMENTS

| | | |
|---|---|---|
| EP | 0 609 074 A2 | 1/1994 |
| JP | 09-113885 | 10/1985 |
| JP | 64-038726 | 8/1987 |
| JP | 03-271718 | 3/1990 |
| JP | 04-019710 | 5/1990 |
| JP | 03-026121 | 3/1991 |
| JP | 03-058026 | 3/1991 |
| JP | 08-172094 | 2/1994 |
| JP | 08-006059 | 6/1994 |
| JP | 07-311385 | 11/1995 |
| JP | 05/002181 A | 1/1998 |
| JP | 10-170941 A | 6/1998 |
| JP | 10-274779 | 10/1998 |
| JP | 11-024096 | 1/1999 |
| JP | 2000-214455 | 8/2000 |

* cited by examiner

Primary Examiner—James A. Dudek
(74) Attorney, Agent, or Firm—Harness, Dickey & Pierce, P.L.C.

(57) ABSTRACT

The liquid crystal device comprises a pair of substrates 11a and 11b facing each other with liquid crystal interposed therebetween and having aluminum electrodes 15a formed on opposing surfaces of the substrates that face each other and also comprises a protruding portion 30 provided on one substrate 11a of the pair of substrates 11a, 11b extending toward the outside from the other substrate 11b, wherein the aluminum electrodes 15a extend along the protruding portion 30 and an overcoat layer 16a is provided on the aluminum electrodes 15a extending along the protruding portion 30.

20 Claims, 12 Drawing Sheets

COMPOSITION OF
COATING MATERIAL

| COMPONENT | CONTENT (PERCENT BY WEIGHT) |
|---|---|
| $TiO_2$ | 50 |
| $ZrO_2$ | 10 |
| $SiO_2$ | 20 |
| $Sb_2O_5$ (FILLER) | 12 |
| $SiO_2$ (FILLER) | 8 |

LIQUID CRYSTAL DEVICE AND ELECTRONIC APPARATUS

BACKGROUND OF THE INVENTION

INDUSTRIAL FIELD OF THE INVENTION

The present invention relates to a liquid crystal device for displaying information by controlling alignment of liquid crystal encapsulated between a pair of substrates. The present invention also relates to an electronic apparatus configured by using the liquid crystal device.

DESCRIPTION OF THE RELATED ART

Currently, in electronic apparatuses such as mobile phones and mobile information terminals, liquid crystal devices are widely used for displaying information, such as characters, numerals, and pictures.

In the liquid crystal devices, for example, pixels are formed by crossing scanning electrodes formed on one substrate and selection (data) electrodes formed on the other substrate at a plurality of points in the form of a dot matrix. Liquid crystal is encapsulated between the substrates and light passing through liquid crystal at each pixel is modulated by selectively changing a voltage applied to the pixel, and thus, images, such as characters, are displayed.

In the liquid crystal device, in order to secure a connecting area for connecting liquid crystal driver ICs and external circuits additionally connected to the liquid crystal device, a protruding portion protruding outside from the area in[at] which the liquid crystal is encapsulated is provided in at least one of the substrates. In addition, in general, the scanning electrodes or the selection electrodes extend from the area at which the liquid crystal is encapsulated to the protruding portion so as to form extending portions reaching the connecting area. Thus, the scanning electrodes or the selection electrodes are connected to the external circuit via the extending portions formed at the protruding portion.

In a so-called reflective or transflective liquid crystal device, a metal having a high reflectance is used as a material for the scanning electrodes or the selection electrodes, and scanning electrodes or selection electrodes may also be used as an inside reflector in some cases. In particular, when aluminum is used as an electrode material, there is a problem in that the extending portions of individual electrodes at the protruding portion are damaged or are readily electrolytically corroded. Electrolytic corrosion is a phenomenon in which electrodes are depleted by corrosion caused by an interaction between various elements, such as bases present at the protruding portion, potential difference between electrodes, and moisture in the air. When electrolytic corrosion occurs, problems of non-illuminated lines due to breakage of the electrodes and the like occur.

In addition, when the extending portions of individual electrodes are exposed, there is a risk of short-circuits between electrodes caused by electrically conductive foreign materials which may contact the protruding portions of electrodes.

In order to prevent damage, corrosion of electrodes, and short-circuits between electrodes, conventionally a structure covering the protruding portion of the electrodes is known, in which a coating material composed of, for example, a silicone, is coated onto the surface of the protruding portion and is adhered thereto. By the structure thus described, contacts of foreign material and the like with the extending portions of the electrodes can be avoided and the influence of moisture is suppressed to some extent. However, even though damage of the electrodes caused by foreign material and short-circuits between the electrodes can be prevented by the method of adhering the coating material mentioned above, it has been difficult to completely avoid electrolytic corrosion due to insufficient sealing properties against water and the like caused by the properties of the coating material or an insufficient adhering state thereof.

SUMMARY OF THE INVENTION

An object of the present invention is to provide a liquid crystal device in which electrolytic corrosion of electrodes provided at a protruding portion of a substrate can be prevented, and to provide an electronic apparatus provided with the liquid crystal device.

A liquid crystal device of the present invention comprises a pair of substrates, each having an opposing face opposing each other with liquid crystal interposed therebetween, and each opposing face is provided with electrodes; a protruding portion provided at one of said pair of substrates protruding toward the outside from the other substrate; aluminum electrodes formed on the protruding portion and being in electrical contact with the electrodes; and an overcoat layer composed of an inorganic substance covering the aluminum electrodes.

According to the liquid crystal device, since the aluminum electrodes formed on the protruding portion are covered with the overcoat layer composed of an inorganic substance having superior sealing properties, penetration of water to the aluminum electrodes can be effectively avoided, and hence, electrolytic corrosion of the aluminum electrodes can be reliably prevented.

The liquid crystal device may further comprise an insulating layer covering the electrodes formed on one of said pair of substrates, and the overcoat layer may be formed as the same layer as the insulating layer.

In this case, since the overcoat layer and the insulating layer can be simultaneously formed, the overcoat layer can be formed without complicating the manufacturing process.

The overcoat layer may be formed by a sol-gel reaction.

In this case, compared to the formation of a silicon oxide film as an overcoat layer by a sputtering method, the configuration of manufacturing apparatuses is simple and inexpensive, and the yield can be improved because of a simpler manufacturing process. In cases where a coating material is cured to cause a sol-gel reaction thereby forming an overcoat layer, it is not required to add a step for patterning the overcoat layer because the coating material can be coated in a predetermined shape using a printing method.

The electrodes formed on one of said pair of substrates may be composed of aluminum and may be formed as the same layer as the aluminum electrodes.

In this case, a preferable structure as a reflective or a transflective liquid crystal panel can be obtained.

The aluminum electrodes may be provided with terminal portions to be connected with external circuit connecting portions, and the overcoat layer may be formed so as not to cover the terminal portions.

In this case, since the surfaces of the terminal portions are exposed, the external circuit connecting portions can be reliably connected to the terminal portions.

The terminal portions and the external circuit connecting portions may be connected to each other via an anisotropic conductive film provided at the terminal portions. In this case, the terminal portions and the external circuit connecting portions may be connected to each other in a state in which a part of the overcoat layer is overlaid with a part of the anisotropic conductive film.

In this case, since the entirety of the aluminum electrodes is covered with at least one of the overcoat layer and the anisotropic conductive film, penetration of water and the like to the entirety of the aluminum electrodes can be effectively prevented.

The terminal portions and the external circuit connecting portions may be connected to each other in a state in which there is an area at which the overcoat layer and the connecting portions overlap each other.

In this case, the anisotropic conductive film provided at the area of the connecting portions is overlaid on a part of the overcoat layer in a connecting step, and as a result, the entirety of the aluminum electrodes is covered with at least one of the overcoat layer and the anisotropic conductive film. Consequently, penetration of water and the like to the entirety of the aluminum electrodes can be effectively prevented.

The terminal portions and the external circuit connecting portions may be connected to each other in a state in which an edge face of the overcoat layer and an edge face of the connecting portions oppose each other.

In this case, the anisotropic conductive film provided at the area of the connecting portions is overlaid on a part of the overcoat layer by a flow that occurs when the anisotropic conductive film melts in a connecting step, and as a result, the entirety of the aluminum electrodes is covered with at least one of the overcoat layer and the anisotropic conductive film. Consequently, penetration of water and the like to the entirety of the aluminum electrodes can be effectively prevented.

After a part of the anisotropic conductive film is overlaid on a part of the overcoat layer, the anisotropic conductive film may be melted so that the terminal portions and the external circuit connecting portions are connected to each other.

In this case, since a part of the anisotropic conductive film is overlaid on a part of the overcoat layer beforehand, whereby the anisotropic conductive film can be reliably overlaid on a part of the overcoat layer.

After the anisotropic conductive film is provided so that the overcoat layer is not overlaid with the anisotropic conductive film, the terminal portions and the external circuit connecting portions may be connected to each other in a state in which a part of the overcoat layer is overlaid with a part of the anisotropic conductive film by a flow thereof when the anisotropic conductive film is melted.

In this case, by using a flow of the anisotropic conductive film when it is melted, the anisotropic conductive film can be overlaid on a part of the overcoat layer.

An electronic apparatus of the present invention comprises one of the liquid crystal devices described above.

BRIEF DESCRIPTION OF THE DRAWINGS

FIG. 7 shows a composition of a coating material.

DETAILED DESCRIPTION OF THE PREFERRED EMBODIMENTS

A first embodiment of a liquid crystal device of the present invention will be described with reference to FIGS. 1 to 7.

Figure 1:
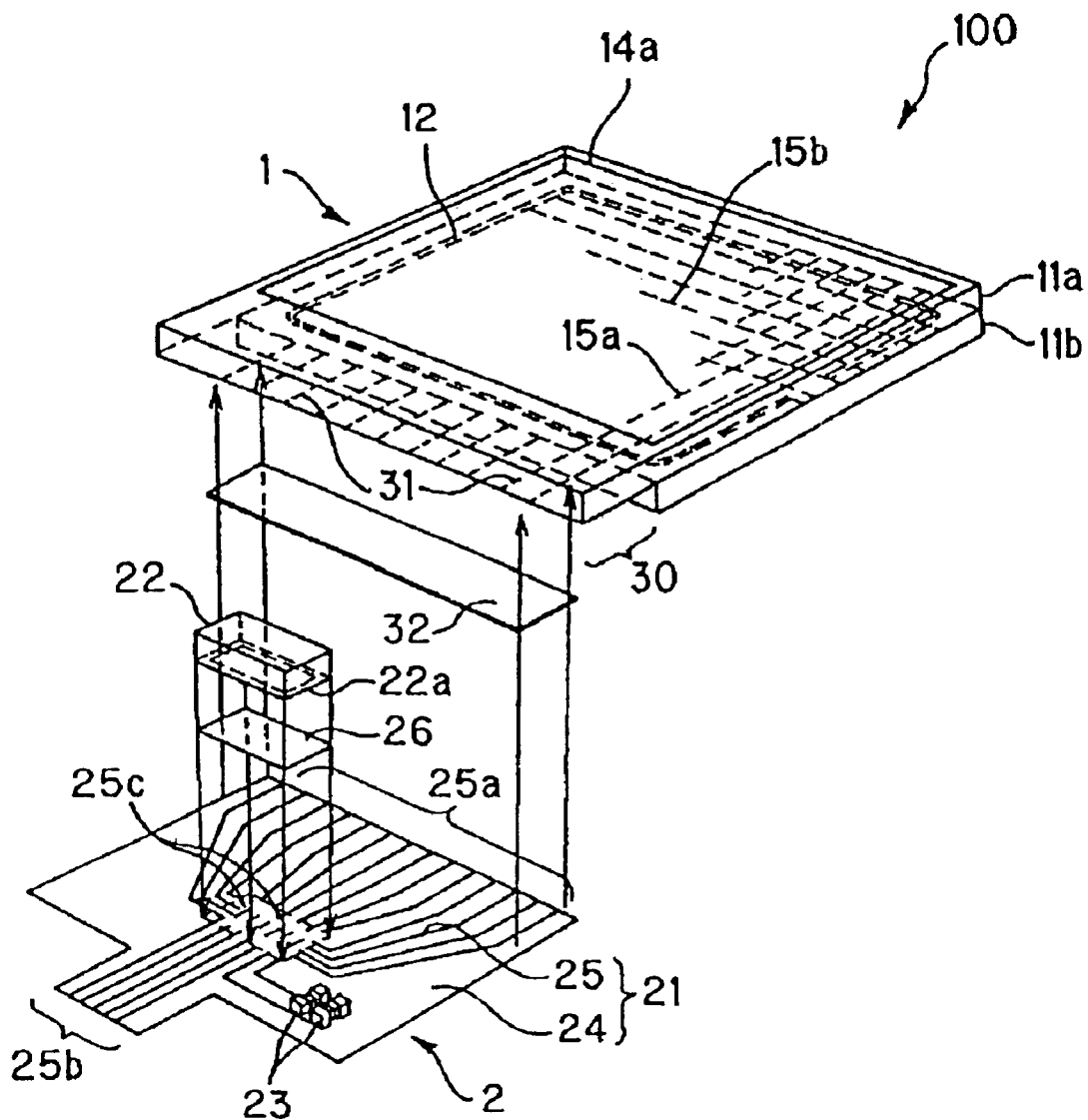
FIG. 1 is an exploded perspective view showing a first embodiment of a liquid crystal device according to the present invention.
Figure 2:
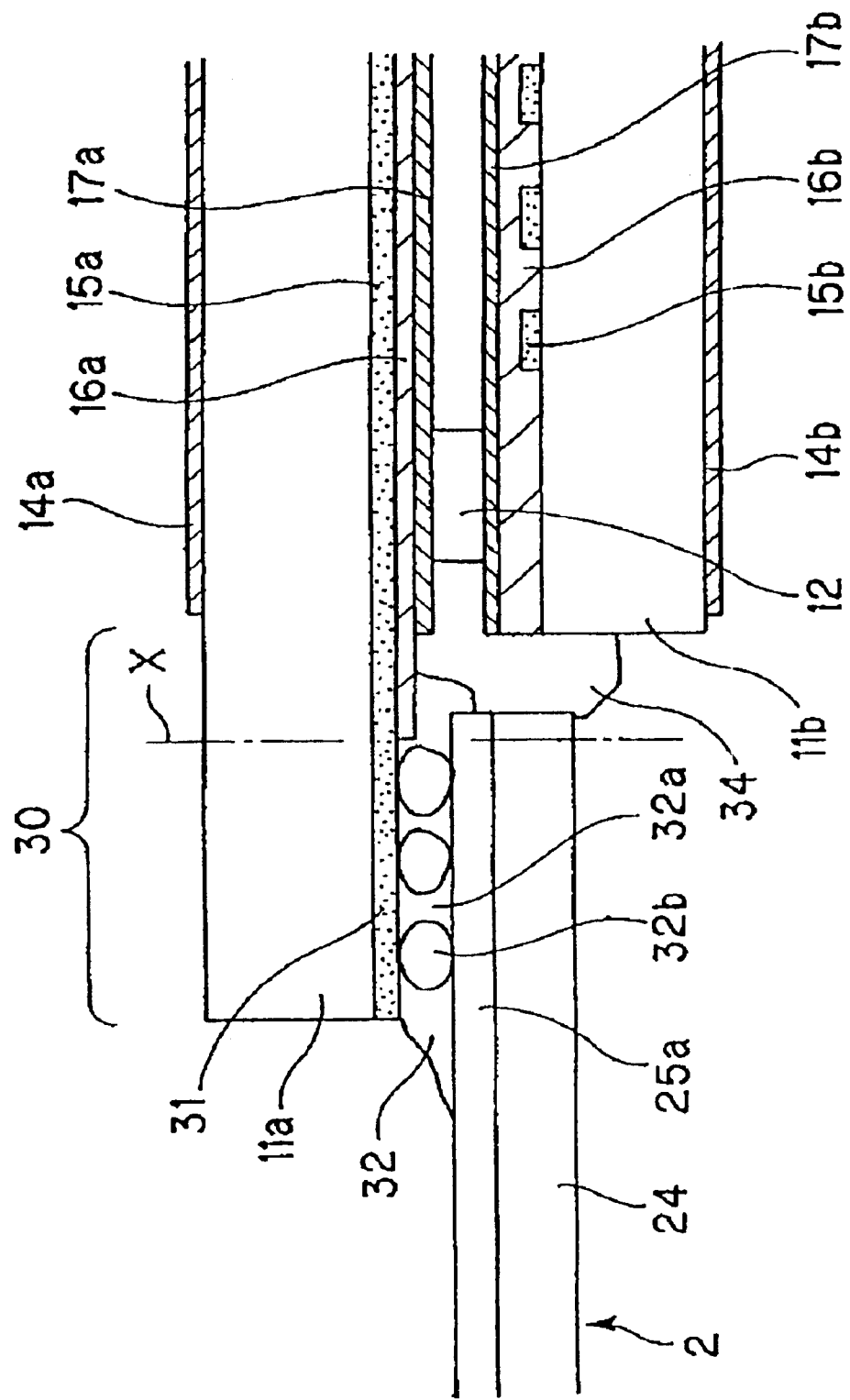
FIG. 2 is a cross-sectional view of the liquid crystal device of the first embodiment.

FIG. 1 is an exploded perspective view of the liquid crystal device of the embodiment, FIG. 2 is a cross-sectional view showing a connection part between a liquid crystal panel 1 and a mounted structure 2. As shown in FIG. 1, a liquid crystal device 100 is provided with the liquid crystal panel 1 displaying information and the mounted structure 2 to be connected with the liquid crystal panel 1. In addition, when necessary, a lighting unit, such as a backlight, and other accessory units (not shown) are provided to the liquid crystal panel 1.

As shown in FIGS. 1 and 2, the liquid crystal panel 1 is provided with a pair of substrates 11a and 11b composed of a light-transmitting material, such as glass or a synthetic resin. The substrates 11a and 11b are bonded to each other with a sealing material 12 provided at the peripheries thereof, and liquid crystal is encapsulated in a gap, a so-called cell gap, formed between the substrate 11a and the substrate 11b in the area surrounded by the sealing material 12. In addition, polarizers 14a and 14b are glued on the outside surfaces of the substrates 11a and 11b, respectively.

As shown in FIG. 1, a plurality of aluminum electrodes 15a and a plurality of transparent electrodes 15b are formed on the inside surfaces of the substrates 11a and 11b, respectively, in the form of stripes. The directions, in which the aluminum electrodes 15a and the transparent electrodes 15b extend, cross orthogonally to each other, and pixels are formed at individual intersections formed by the aluminum electrodes 15a and the transparent electrodes 15b. Accordingly, a plurality of pixels are aligned in the form of a dot matrix. The transparent electrode 15b is formed using a light-transmitting material, such as ITO (indium tin oxide compound).

Instead of the aluminum electrodes 15a or the transparent electrodes 15b in the form of stripes, electrodes having other patterns such as characters and numerals may be formed on the inside surface of the substrate.

As shown in FIG. 2, an overcoat layer 16a composed of an inorganic film is provided on the aluminum electrodes 15a formed on the substrate 11a (lower side of the aluminum electrodes 15a in FIG. 2) so as to cover the entire display area in which the pixels are aligned. In addition, an alignment film 17a composed of, for example, a polyimide resin, is provided on the overcoat layer 16a so as to cover the entire display area.

Furthermore, an overcoat layer 16b composed of an inorganic film is provided on the transparent electrodes 15b formed on the substrate 11b (upper side of the transparent electrodes 15b in FIG. 2) so as to cover the entire display area. In addition, an alignment film 17b composed of, for example, a polyimide resin, is provided on the overcoat layer 16b so as to cover the entire display area.

The thicknesses of the overcoat layers 16a and 16b are set to be, for example, 800 Å, and the thicknesses of the alignment layers 17a and 17b are set to be, for example, 150 Å.

As shown in FIGS. 1 and 2, the substrate 11a has a protruding portion 30 over the edge of the substrate 11b to the left in FIG. 2. On the protruding portion 30, a plurality of terminal portions 31 are formed by extending the aluminum electrodes 15a to the edge of the substrate 11a. As shown in FIG. 2, portions of the aluminum electrodes 15a, which are not provided with the overcoat layer 16a and the alignment layer 17a thereon and exposed at the inside surface of the substrate 11a, function as the terminal portions 31 which are to be connected with the mounted structure 2 via an ACF (anisotropic conductive film) described later.

Figure 3:
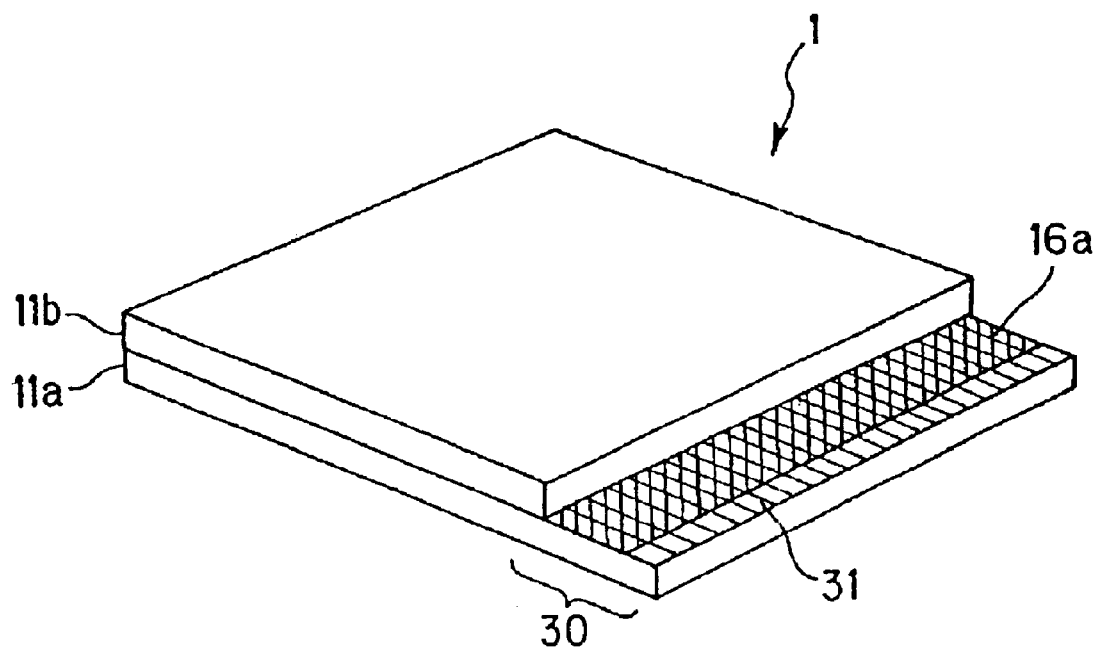
FIG. 3 is a perspective view of a liquid crystal device showing an area at which an overcoat layer is formed in the liquid crystal device of the first embodiment.

FIG. 3 is a perspective view of the liquid crystal panel 1 showing an area at which the overcoat layer 16a is formed. As shown in FIGS. 2 and 3, the overcoat layer 16a provided at the substrate 11a side is continuously formed from the display area to the protruding portion so as not to cover the terminal portions 31 formed on the edge portion of the substrate 11a.

In the embodiment, the inside surface of the substrate 11a in the protruding portion 30 other than the area at which the terminal portions 31 are formed is covered with the overcoat layer 16a. As a result, in a manufacturing process, the risk of the aluminum electrodes 15a being damaged or foreign material adhering thereon is avoided in the area at which the aluminum electrodes 15a are covered with the overcoat layer 16a. In addition, the penetration of water and the like to the aluminum electrodes 15a can be prevented, and hence, degradation of the aluminum electrodes 15a can be prevented.

As shown in FIG. 1, the mounted structure 2 is provided with a wiring substrate 21, a liquid crystal driver IC (integrated circuit) 22 and chip components which are mounted on the wiring substrate 21.

The wiring substrate 21 is composed of a wiring pattern of copper or the like formed on a resilient base substrate 24 made of a polyimide resin or the like. The wiring pattern 25 may be tightly bonded on the base substrate 24 with a bonding agent layer, or may be tightly bonded directly to the base substrate 24 by a film forming method, such as sputtering or roll coating. In addition, the wiring substrate 21 may be formed by using a wiring pattern of copper or the like formed on a relatively rigid and thick substrate, such as an epoxy substrate.

A COF (chip on film) type mounted structure is formed by mounting parts to be mounted on a resilient substrate that is used as the wiring substrate 21, and a COB (chip on board) type mounted structure is formed by mounting parts to be mounted on a rigid substrate that is used as the wiring substrate 21.

As shown in FIG. 1, the wiring pattern 25 includes a plurality of output terminals 25a formed at one side of the wiring substrate 21, a plurality of input terminals 25b formed at the other side of the wiring substrate 21, and a plurality of IC terminals 25c provided in an area at which the liquid crystal driver IC 22 is mounted.

A plurality of bumps 22a are provided on a bonding face of the liquid crystal driver IC 22, i.e., on an active face thereof, and individual bumps 22a are electrically connected to predetermined IC terminals 25c via an ACF (anisotropic conductive film) 26. The chip components 23 are mounted at predetermined positions on the wiring substrate 21 by soldering. The chip components 23 are active parts such as capacitors and resistors, and electronic elements such as connectors.

The mounted structure 2 is connected to the terminal portions 31 formed on the protruding portion 30 of the substrate 11a by an ACF 32. As shown in FIG. 2, the ACF 32 is composed of an adhesive resin 32a and electrically conductive particles 32b mixed in the adhesive resin 32a, and an edge portion of the mounted structure 2 at which the output terminals 25a are formed and the protruding portion 30 of the substrate 11a are bonded to each other by the adhesive resin 32a. In addition, the terminal portions 31 and the output terminals 25a, which oppose each other, are electrically connected to each other via the electrically conductive particles 32b interposed between the mounted structure 2 and the substrate 11a. A gap formed between the base substrate 24 and the substrate 11b is sealed with a resinous sealing material 34.

As shown in FIG. 2, the left edge face of the overcoat layer 16a (a position indicated by a chain line in FIG. 2) is positioned to the left of the right edge face of the base substrate 24, that is, the base substrate 24 and the overcoat layer 16a horizontally overlap each other with a positional relationship therebetween. When the mounted structure 2 and the liquid crystal panel 1 are connected to each other, the melted ACF 32 spreads to the right side (display area side) of the right edge face of the base substrate 24 and is solidified to be overlaid on the overcoat layer 16a.

When the mounted structure 2 is connected to the terminal portions 31, a heat compression bonding head presses the mounted structure 2 while the output terminals 25a of the mounted structure 2 are placed on the terminal portions 31 with the ACF 32 therebetween, and heat and pressure are applied to the mounted structure 2. As a result, the adhesive resin 32a of the ACF 32 is melted and then spreads slightly towards the left side from the left edge face of the substrate 11a and slightly towards the right side from the right edge face of the base substrate 24. When the ACF 32 is spontaneously cooled by removing the heat compression bonding head, the adhesive resin 32 is solidified in a state in which the output terminals 25a and the terminal portions 31 are electrically connected with each other via the electrically conductive particles 32b.

As described above, the gap formed between the base substrate 24 and the substrate 11b is sealed with the resinous sealing material 34; however, the sealing properties by the resinous sealing material 34 are not always sufficient and a certain degree of penetration of water and the like is allowed. Meanwhile, in the embodiment as described above, since the ACF 32 is overlaid on the overcoat layer 16a. the overcoat layer 16a is present between the aluminum electrodes 15a and the resinous sealing material 34, and hence the aluminum electrodes 15a are not in direct contact with the resinous sealing material 34. As a result, penetration of water and the like to the aluminum electrodes 15a via chinks formed in the resinous sealing material 34 and the periphery thereof can be effectively prevented.

Figure 4:
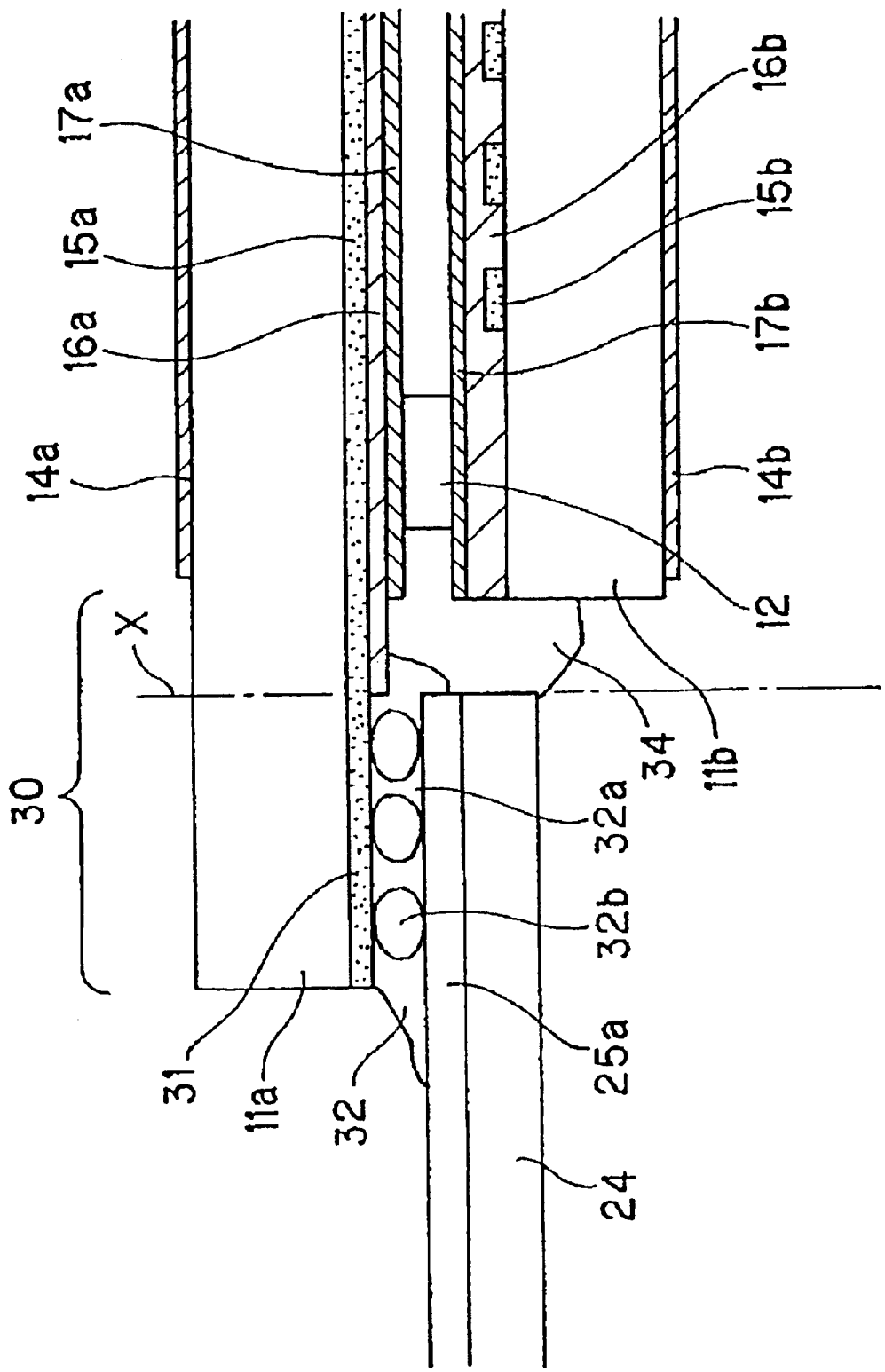
FIG. 4 is a cross-sectional view showing a state in which the left edge face of an overcoat layer and the right edge face of a base layer oppose each other.

FIG. 4 shows the case in which the left edge face of the overcoat layer 16a (a position indicated by a chain line X in FIG. 4) and the right edge face of the base substrate 24 are at the same position in the horizontal direction, that is, the case in which the left edge face of the overcoat layer 16a and the right edge face of the base substrate 24 oppose each other. In the case as shown in FIG. 4, the melted ACF 32 spreads to the right side from the right edge face of the base substrate 24, and hence, the ACF is solidified in a state in which the ACF is overlaid on the overcoat layer 16a. Accordingly, penetration of water and the like to the aluminum electrodes 15a can also be prevented in this case.

Figure 5:
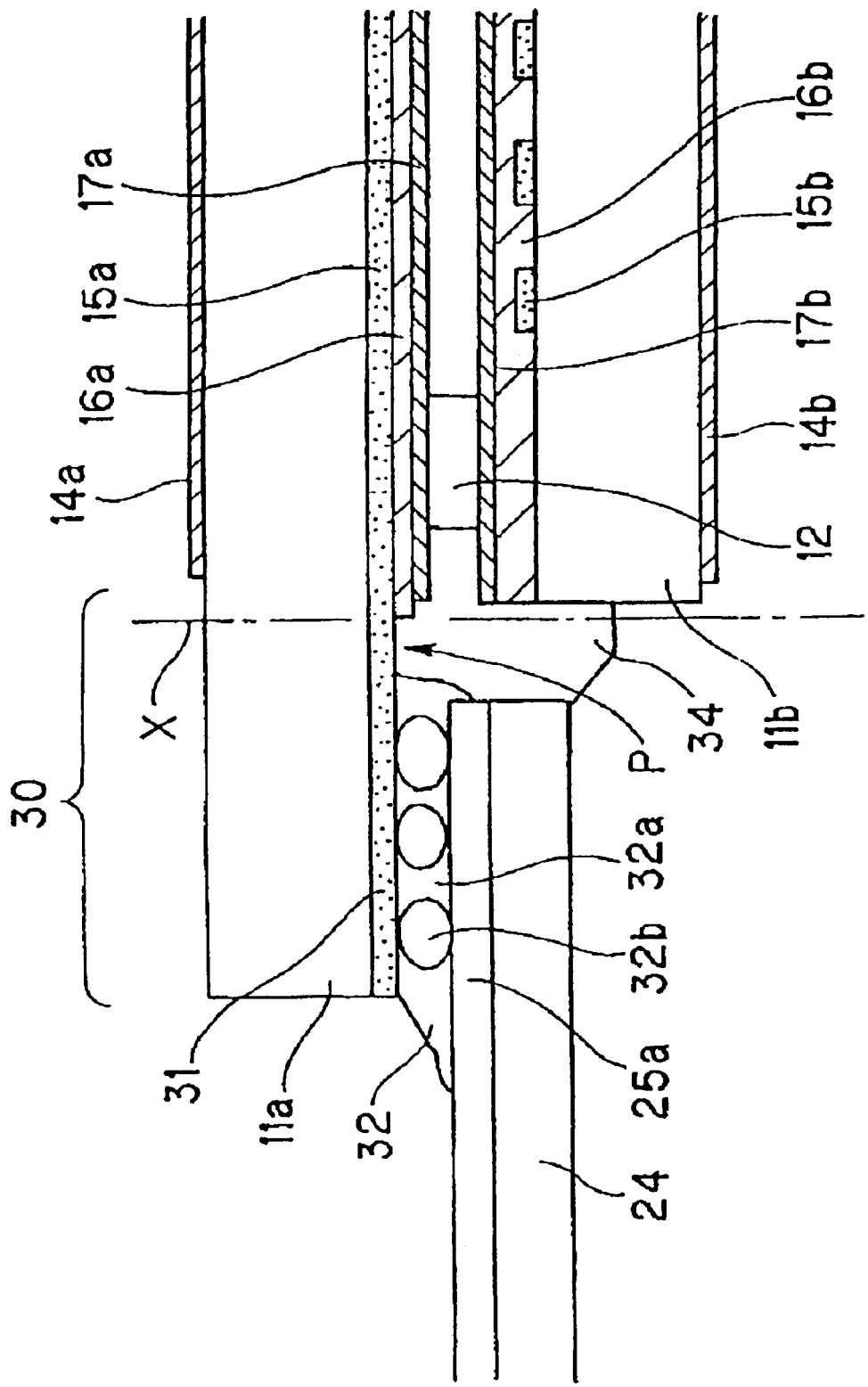
FIG. 5 is a cross-sectional view showing a state in which the left edge face of an overcoat layer is at a position withdrawn from the right edge face of a base layer.

Conversely, in FIG. 5, the left edge face of the overcoat layer 16a (a position indicated by a chain line X in FIG. 5) is at a position withdrawn to the right from the right edge face of the base substrate 24. Hence, the melted ACF 32 does not reach the position at which the overcoat layer 16a exists, and parts of the aluminum electrodes 15a are in direct contact with the resinous sealing material 34. Consequently, it is not preferable bacause, in this case, water and the like penetrating into the resinous sealing material 34 may reach the aluminum electrodes 15a. In FIG. 5, an area at which the aluminum electrodes 15a are in direct contact with the resinous sealing material 34 is indicated by a letter of "P".

As described above, a structure in which the overcoat layer 16a and the ACF 32 are overlapped is preferable. Accordingly, the ACF 32 may be overlaid on the overcoat layer 16a before the ACF 32 is melted, and then the ACF 32 may be melted to connect the liquid crystal panel 1 with the mounted structure 2, or, without overlaying the ACF 32 before melting on the overcoat layer 16a beforehand, the ACF 32 may be melted and flow to be overlaid on the overcoat layer 16a.

Figure 6:
FIG. 6 shows a part of a manufacturing process for the liquid crystal panel, in which (a) is a cross-sectional view of a substrate, (b) is a cross-sectional view showing a state in which an aluminum electrode is formed, (c) is a cross-sectional view showing a state in which an overcoat layer is formed, and (d) is a cross-sectional view showing a state in which an alignment layer is formed.
Figure 6:
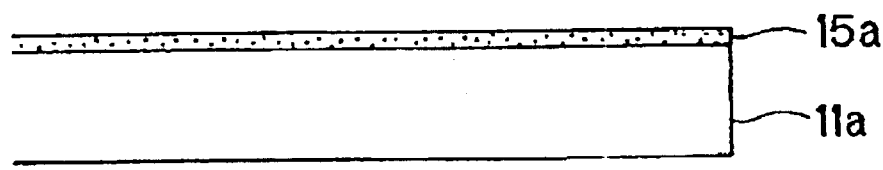
Figure 6:
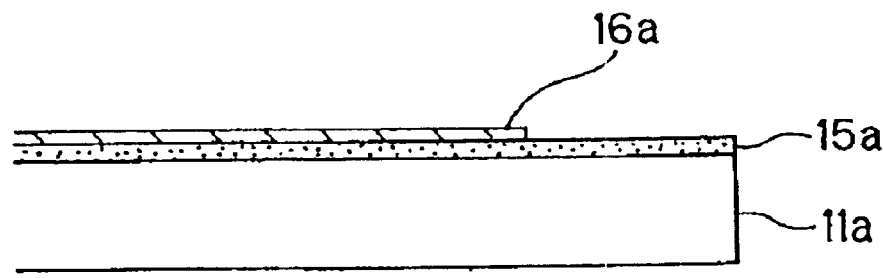
Figure 6:
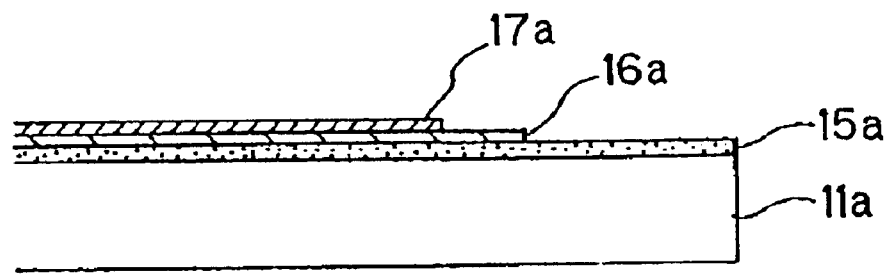

Hereinafter, a part of a manufacturing process for the liquid crystal panel 1 will be described with reference to FIG. 6. FIGS. 6(a) to 6(d) are cross-sectional views sequentially showing the manufacturing process. As shown in FIGS. 6(a) and 6(b), an aluminum film is formed on the substrate 11a, and then the aluminum electrodes 15a are formed by patterning the aluminum film in a photolithographic step. Next, the substrate 11a provided with the aluminum electrodes 15a is rinsed.

Subsequently, by using relief printing or transfer printing, a coating material for forming the overcoat layer 16a is coated on a predetermined area. FIG. 7 shows components composing the coating material and an example of weight ratios of the components. As shown in FIG. 7, the coating material includes titanium oxide, zirconium oxide, and silicon oxide, which form inorganic films by a sol-gel reaction, and also includes antimony oxide and silicon oxide, which are used as fillers. After coating the coating material, pre-baking is performed at 100° C. for 2 minutes to remove solvent from the coating material. UV (ultra violet) rays of 365 nm are radiated at 6,000 mJ/cm$^2$ onto the coating material, and then curing at 300° C. for 10 minutes is performed. By the steps of pre-baking, UV radiation, and curing, the coating material forms an inorganic film by a sol-gel reaction, that is, the overcoat layer 16a is formed as shown in FIG. 6(c).

In the case in which the overcoat layer 16a is formed by a sol-gel reaction using the coating material thus described, compared to formation of silicon oxide as an overcoat layer by sputtering, the configuration of manufacturing apparatuses is simple and inexpensive, and in addition, the advantage of a higher yield can be obtained because of a simpler manufacturing process.

The overcoat layer 16b on the substrate 11b is formed in a process similar to that used for forming the overcoat layer 16a, and hence, the overcoat layer 16b has advantages similar to those of the overcoat layer 16a. In addition, since the refractive index of the overcoat layer 16b formed by a sol-gel reaction is lower than that of the silicon oxide film, a phenomenon in which the transparent electrode is noticeably visible after the liquid crystal panel 1 is formed hardly occurs, and the advantage of improved display quality can be obtained.

After the formation of the overcoat layer 16a, the substrate 11a is rinsed, and the alignment film 17a is formed on the overcoat layer 16a by coating as shown in FIG. 6(d).

Hereinafter, a second embodiment of the liquid crystal device according to the present invention will be described with reference to FIGS. 8 to 11. In the second embodiment, the liquid crystal device of the present invention is applied to a COG (Chip on Glass) type device.

Figure 8:
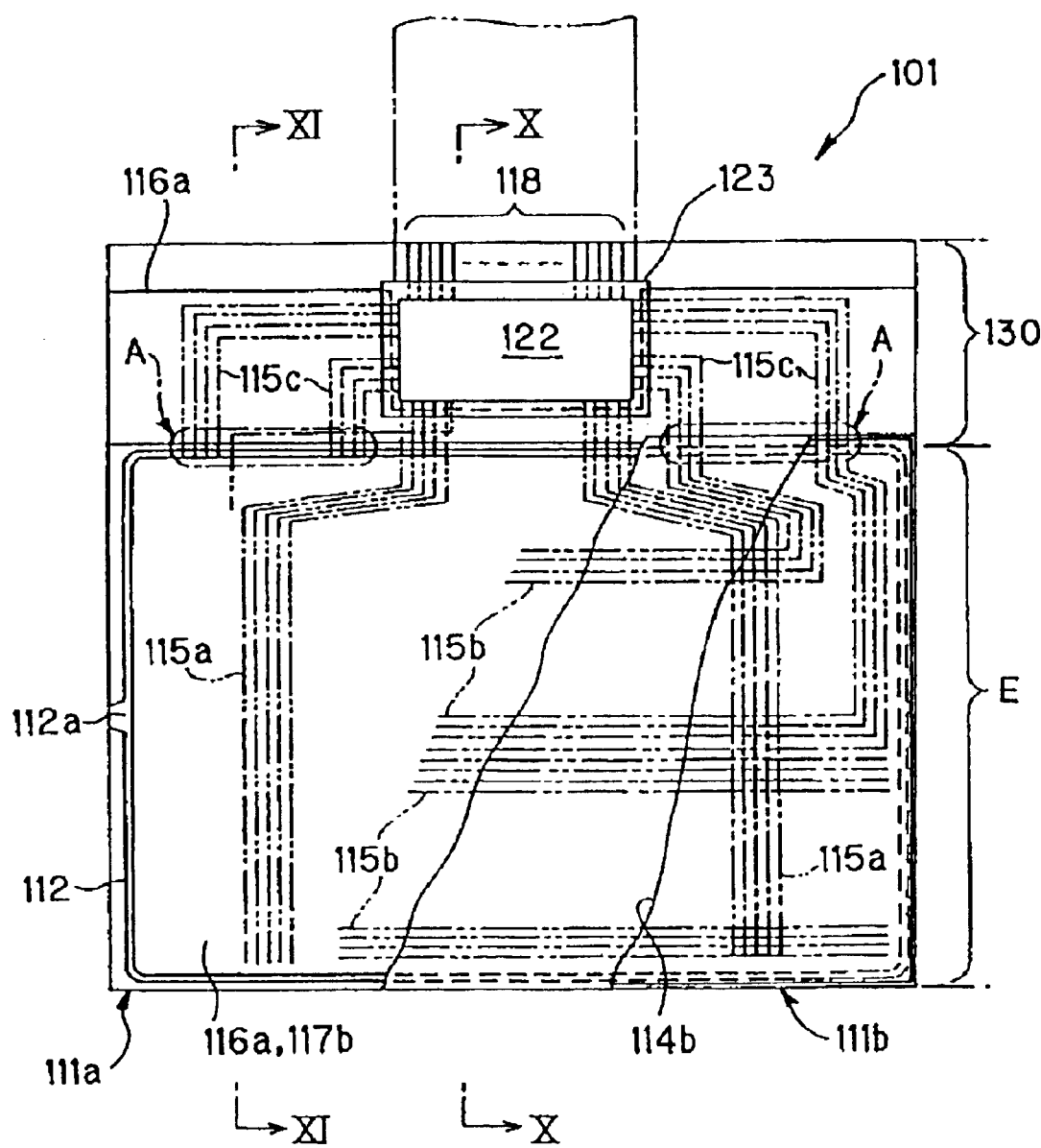
FIG. 8 is a partly sectional plan view showing a second embodiment of a liquid crystal device according to the present invention.
Figure 9:
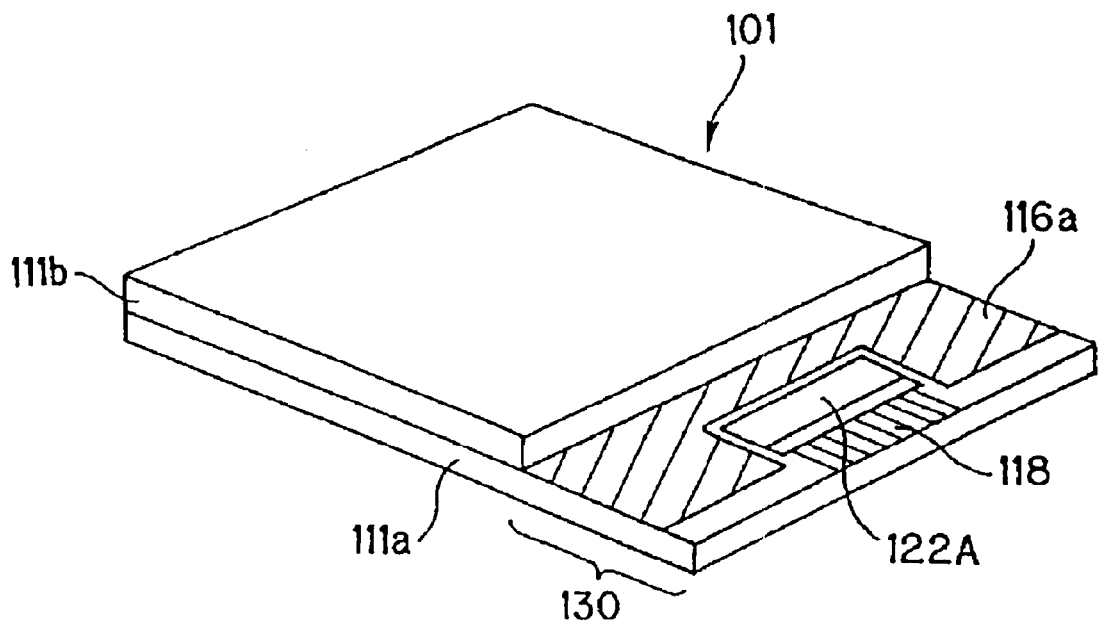
FIG. 9 is a perspective view of the liquid crystal device showing an area at which an overcoat layer is formed in the liquid crystal device of the second embodiment.
Figure 10:
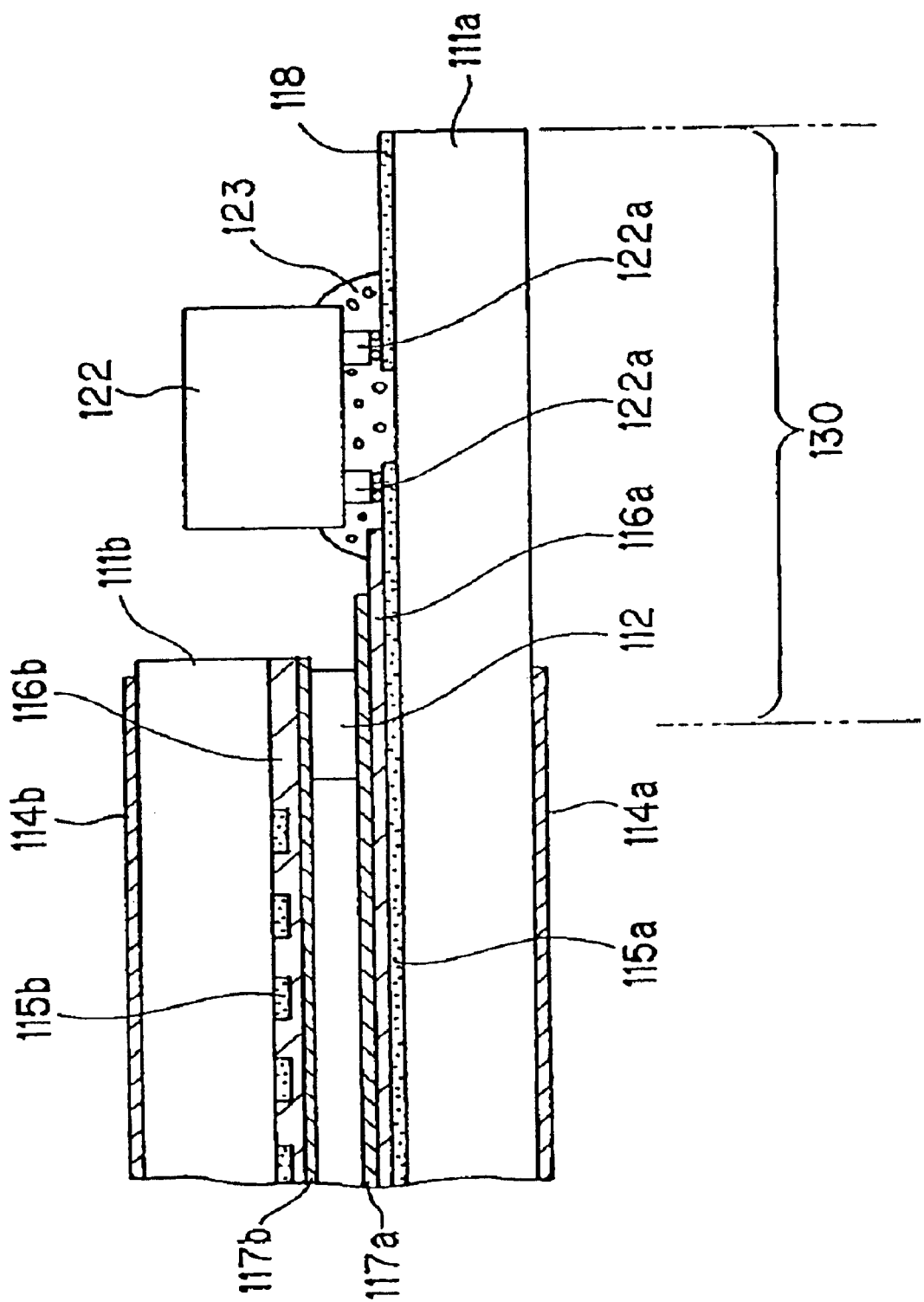
FIG. 10 is a cross-sectional view taken along the line X—X in FIG. 8.
Figure 11:
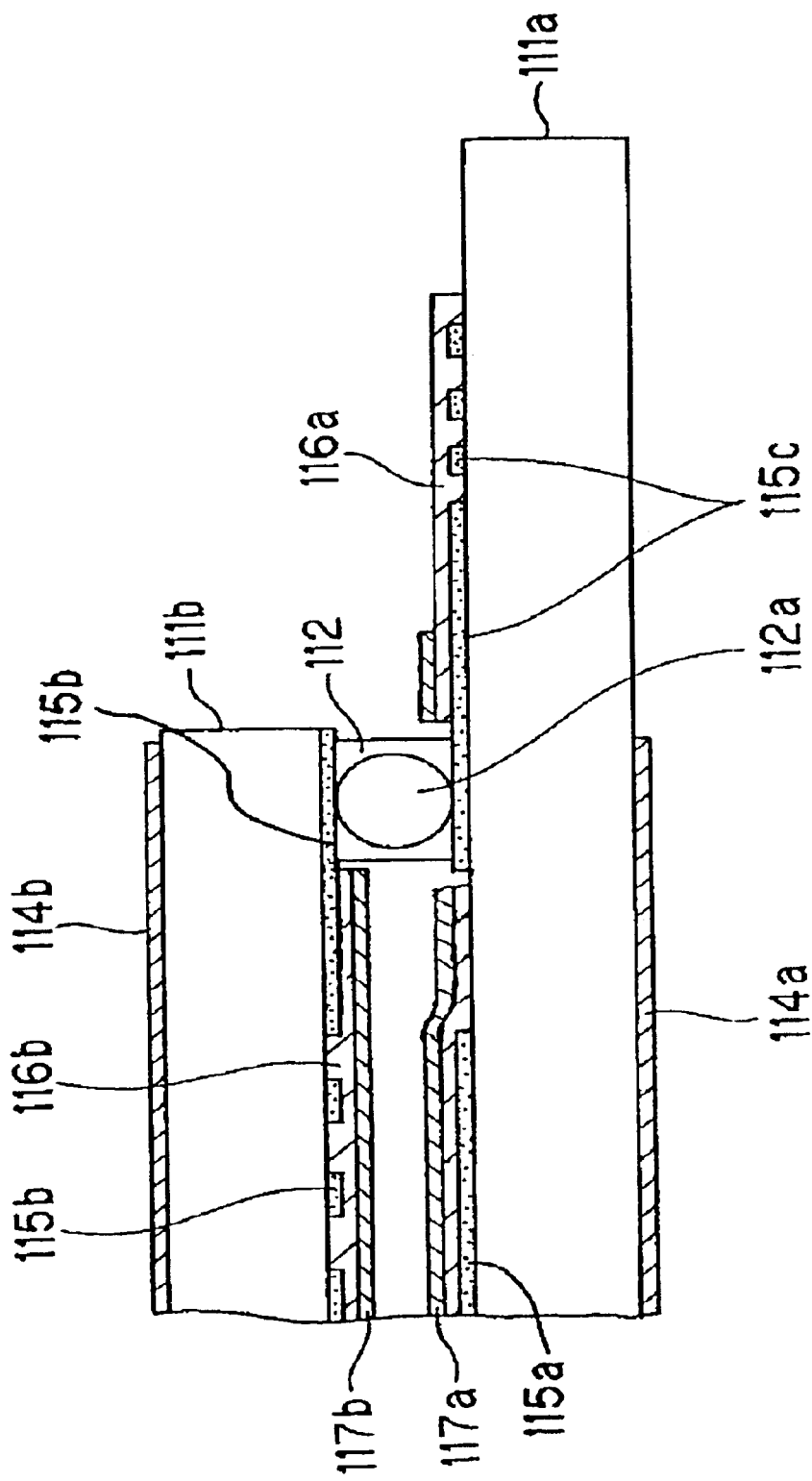
FIG. 11 is a cross-sectional view taken along the line XI—XI in FIG. 8.

FIG. 8 is a plan view showing positional relationships of individual elements of a liquid crystal panel used for the liquid crystal device of the second embodiment, FIG. 9 is a perspective view of the liquid crystal panel, FIG. 10 is a cross-sectional view taken along the line X—X in FIG. 8, and FIG. 11 is a cross-sectional view taken along the line XI—XI in FIG. 8.

A liquid crystal panel 101 is provided with a pair of substrates 111a and 111b composed of an light-transmitting material, such as glass or a synthetic resin. The substrate 111a and the substrate 111b are bonded to each other with a sealing material 112 disposed at peripheries of the substrates 111a and 111b, and liquid crystal is encapsulated in a gap, a so-called cell gap, formed between the substrate 111a and the substrate 111b in an area surrounded by the sealing material 112. A polarizer 114a and a polarizer 114b are glued on the outside surfaces of the substrate 111a and the substrate 111b, respectively (refer to FIGS. 10 and 11).

As shown in FIGS. 8 and 10, a plurality of aluminum electrodes 115a and a plurality of transparent electrodes 115b are formed in the form of stripes on the inside surfaces of the substrate 115a and the substrate 115b, respectively. The directions, in which the aluminum electrodes 115a and the transparent electrodes 115b extend, cross orthogonally, and pixels are formed at individual intersections between the aluminum electrodes 115a and the transparent electrodes 115b. Accordingly, a number of pixels are aligned in the form of a dot matrix in the liquid crystal panel 101. The transparent electrode 115b is formed using an light-transmitting material, such as an ITO (indium tin oxide compound).

Instead of the aluminum electrodes 115a and the transparent electrodes 115b in the form of stripes, electrodes having other patterns, such as characters and numerals, may be formed on the inside surfaces of the substrates.

As shown in FIGS. 10 and 11, an overcoat layer 116a composed of an inorganic substance is provided on the aluminum electrodes 115a formed on the substrate 111a (upper side of the aluminum electrodes 115a in FIGS. 10 and 11) so as to cover the entirety of a display area (area in which images are displayed) E (refer to FIG. 8) of the liquid crystal panel 101. In addition, an alignment film 117a composed of, for example, a polyimide resin, is provided on the overcoat layer 116a so as to cover the entirety of the display area E.

Furthermore, an overcoat layer 116b composed of an inorganic substance is provided on the transparent electrodes 115b formed on the substrate 111b (lower side of the transparent electrode 115b in FIGS. 10 and 11) so as to cover the entirety of the display area E. In addition, an alignment film 117b composed of, for example, a polyimide resin, is provided on the overcoat layer 116b so as to cover the entirety of the display area E.

The overcoat layers 116a and 116b are inorganic films, similar to those formed in the first embodiment, formed by a sol-gel reaction passing through steps of coating a coating material, pre-baking, UV radiation, and curing. Since the manufacturing process is similar to that in the first embodiment, an explanation of the manufacturing process is omitted.

The thicknesses of the overcoat layers 116a and 116b are set to be, for example, 800 Å, and the thicknesses of the alignment layers 117a and 117b are set to be, for example, 150 Å.

As shown in FIG. 8, the substrate 111a has a protruding portion 130 protruding from the display area E to the upper side in FIG. 8. On the protruding portion 130 of the substrate 111a, a liquid crystal driver IC 122 is provided and the aluminum electrodes 115a are extended from the display area E. These aluminum electrodes 115a are connected to the liquid crystal driver IC 122. In addition, aluminum electrodes 115c connecting the display area E with the liquid crystal driver IC 122 are formed on the protruding portion 130. The aluminum electrodes 115c are connected to the transparent electrodes 115b on the substrate 111b through the sealing material 112, and the connection configuration thereof will be described later. Furthermore, a plurality of input terminals 118 are provided at an edge portion (upper edge portion in FIG. 8) of the protruding portion 130. The input terminals 118 are connected to the liquid crystal driver IC 122.

In an area indicated by a letter "A", a structure connecting the transparent electrodes 115b with the aluminum electrodes 115c is formed. As shown in FIG. 11, since the overcoat layer 116a, the alignment film 117a, the overcoat layer 116b, and the alignment film 117b are not formed in this area at which the sealing material 112 is provided, the transparent electrodes 115b and the aluminum electrodes 115c are each in direct contact with[directly connected to] the sealing material 112. Hence, by forming the liquid crystal panel 101 using the sealing material 112, the transparent electrodes 115b and the aluminum electrodes 115c are electrically connected to each other via electrically conductive particles 112a contained in the sealing material 112.

As shown in FIGS. 8 and 10, given bumps 122a of the liquid crystal driver IC 122 are connected to each of the aluminum electrodes 115a, the aluminum electrodes 115c, and the input terminals 118, via an ACF 123.

As shown in FIGS. 8 to 11, the overcoat layer 116a provided at the substrate 11a side is continuously formed from the display area E to the protruding portion 130 other than the area 122a (refer to FIG. 9) at which the liquid crystal driver IC 122 is mounted and the edge portion of the substrate 111a. The aluminum electrodes 115a and the aluminum electrodes 115c thus formed on the protruding portion 130 are covered with the overcoat layer 116a, and hence, there is no risk of the aluminum electrodes 115a or the aluminum electrodes 115c being damaged or foreign material adhering thereto in a manufacturing process. In addition, the penetration of water and the like to the aluminum electrodes 115a and the aluminum electrodes 115c can be prevented, and hence, degradation of these electrodes can be prevented.

As shown in FIG. 10, in the second embodiment, since the overcoat layer 116a is formed in the vicinity of the liquid crystal driver IC 122, the ACF 123 is solidified in a state in which the ACF is melted and flow onto the overcoat layer 116a when the liquid crystal driver IC 122 is mounted on the substrate 111a. Consequently, the aluminum electrodes 115a located on the protruding portion 130 are covered with the overcoat layer 116a or the ACF 123. Even though the aluminum electrodes 115c are not shown in the figure, they are in a state similar to the above. Hence, the risk of penetration of water and the like to the aluminum electrodes 115a and the aluminum electrodes 115c occurring when exposed surfaces of the aluminum electrodes are directly covered by a sealing material can be avoided.

Figure 12:
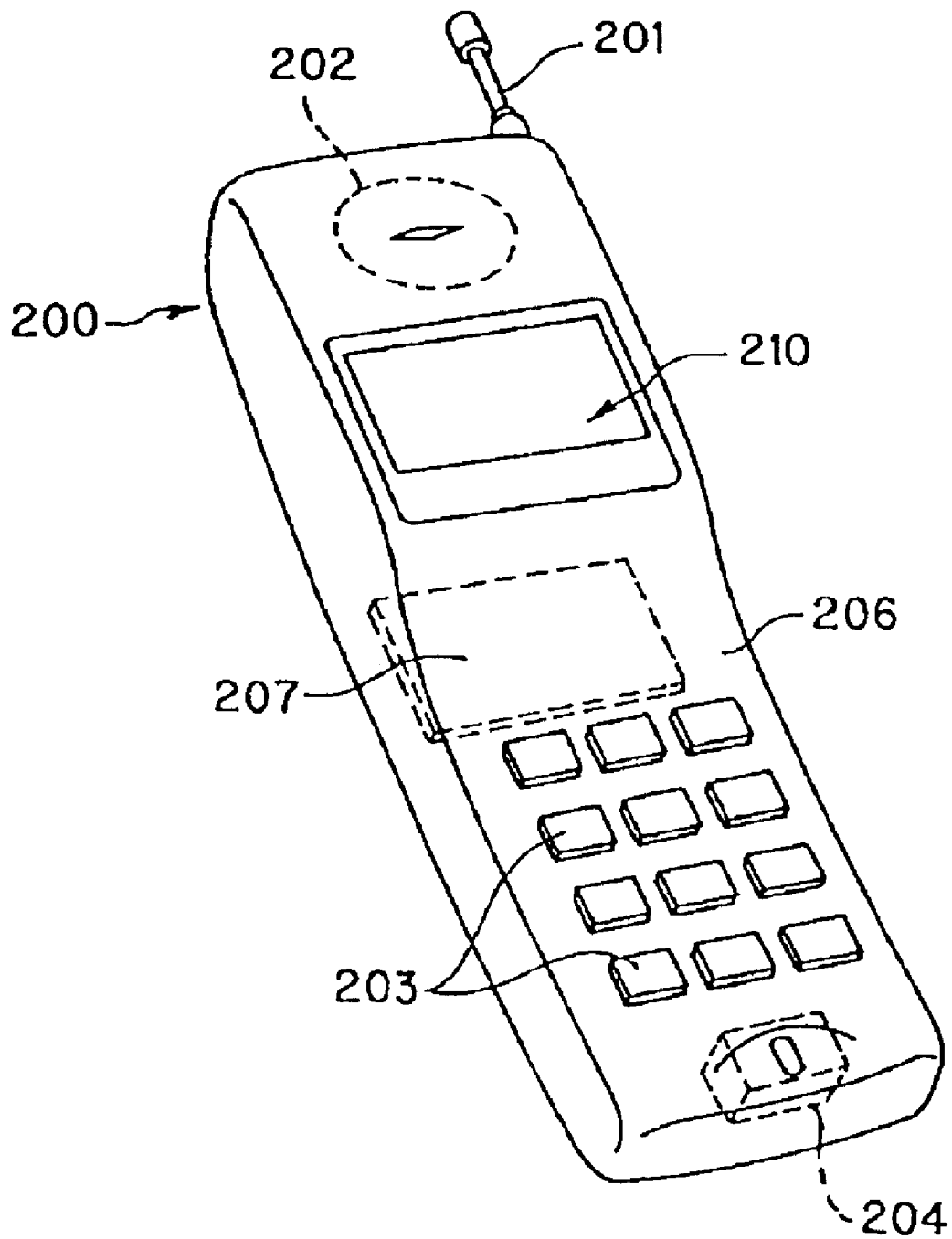
FIG. 12 is a perspective view showing an embodiment of an electronic apparatus according to the present invention.

FIG. 12 shows a mobile phone of an embodiment of the electronic apparatus according to the present invention. A mobile phone 200 shown in the figure has a structure in which components thereof, such as an antenna 201, a speaker 202, a liquid crystal unit 210, key switches 203, and a microphone 204, are stored in an exterior case 206 as a housing. In the inside of the exterior case 206, a control circuit board 207 having control circuits thereon for controlling operation of the components mentioned above is provided. The liquid crystal unit 210 may be constructed by the liquid crystal device 100 shown in FIG. 1 and the like or by the liquid crystal device provided with the liquid crystal panel 101 shown in FIG. 8 and the like.

In the mobile phone 200, signals inputted through the key switches 203 and the microphone 204, data received by the antenna 202 and the like are inputted to the control circuits on the control circuit board 207. Then, the control circuits display images, such as numerals, characters, and pictures, on the display screen of the liquid crystal unit 210 in accordance with the various data inputted. In addition, transmission data are transmitted via the antenna 201.

Hereinbefore, the present invention has been described with reference to preferred embodiments; however the present invention is not limited to the embodiments and may be variably modified within the scope described in the claims.

For example, in the first and the second embodiments, passive matrix liquid crystal devices are described; however, instead of the above, the present invention can be applied to an active matrix liquid crystal device.

In addition, in the embodiment of the electronic apparatus, a mobile phone using the liquid crystal device of the present invention is described as an example of electronic apparatuses; however, the liquid crystal device of the present invention may be applied to other electronic apparatuses, for example, mobile information terminals, electronic notebooks, and view finders for video cameras.

As described above, according to the liquid crystal device of the present invention, since the aluminum electrodes formed on the protruding portion are covered with the overcoat layer composed of an inorganic substance having superior sealing properties, penetration of water to the aluminum electrodes can be avoided, and hence, electrolytic corrosion of the aluminum electrodes can be reliably prevented.

What is claimed is:

1. A liquid crystal device comprising:
   a first substrate having a first face, said first substrate being provided with a first electrode;
   a second substrate having a second face opposing said first face of said first substrate, said second face being provided with a second electrode;
   a liquid crystal interposed between said first and second faces;
   a protruding portion of said first substrate protruding outwardly relative to said second substrate, said first electrode extending from an area where said first and second substrates oppose each other to said protruding portion;
   a driver IC mounted on said protruding portion, said first electrode electrically connected to said driver IC;
   third electrode formed on said first substrate, said third electrode electrically connecting said driver IC and said second electrode; and
   an overcoat layer of an inorganic substance provided with said first substrate and covering said first electrode and said third electrode, said overcoat layer being continuously formed from said area where said first and second substrates oppose each other to said protruding portion and omitted from an area where said first electrode is connected to said driver IC, an area where said third electrode is connected to said driver IC, an area where said third electrode is connected to said second electrode.

2. A liquid crystal device according to claim 1, wherein the electrodes formed on one of said pair of substrates are composed of aluminum and are formed as the same layer as the aluminum electrodes.

3. A liquid crystal device according to claim 1, wherein the aluminum electrodes are provided with terminal portions to be connected with external circuit connecting portions, and the overcoat layer is formed so as to not cover the terminal portions.

4. A liquid crystal device according to claim 3, wherein the terminal portions and the external circuit connecting portions are connected to each other via an anisotropic conductive film provided at the terminal portions.

5. A liquid crystal device according to claim 4, wherein the terminal portions and the external circuit connecting portions are interconnected in a state in which a part of the overcoat layer is overlaid with a part of the anisotropic conductive film.

6. A liquid crystal device according to claim 5, wherein the terminal portions and the external circuit connecting portions are interconnected in a state in which there is an area at which the overcoat layer and the connecting portions overlap each other.

7. A liquid crystal device according to claim 5, wherein the terminal portions and the external circuit connecting portions are interconnected in a state in which edge faces of the overcoat layer and the connecting portions oppose each other.

8. A liquid crystal device according to claim 5, wherein a part of the anisotropic conductive film is provided so as to be overlaid on a part of the overcoat layer, and then the anisotropic conductive film is melted, whereby the terminal portions and the external circuit connecting portions are connected with each other.

9. A liquid crystal device according to claim 5, wherein the anisotropic conductive film is provided so as to not be overlaid on the overcoat layer, and then the anisotropic conductive film is melted to flow so that a part of the overcoat layer is overlaid with a part of the anisotropic conductive layer, whereby the terminal portions and the external circuit connecting portions are connected with each other.

10. An electronic apparatus comprising a liquid crystal device according to claim 1, as display means for displaying images.

11. The liquid crystal device of claim 1, wherein
   the electrodes, formed on the protruding portion are aluminum electrodes.

12. The liquid crystal device of claim 1, further comprising:
   an insulating layer covering one of the first and second electrodes, wherein the overcoat layer further comprises the insulating layer.

13. A liquid crystal device comprising:
   a first substrate having a first face;
   a first electrode on said first face;
   a second substrate having a second face opposite said first face;
   a second electrode on said second face;
   liquid crystal interposed between said first and second faces;
   a protruding portion of said first substrate protruding outboard of said second substrate;
   a driver IC mounted on said protruding portion;
   third electrodes formed on said protruding portion and connected to said driver IC and said second electrodes; and
   an overcoat layer of an inorganic substance provided with said first substrate and covering said first electrode and said third electrodes, said overcoat layer continuously formed from an area where said first and second substrates oppose each other to said protruding portion except in an area where said third electrodes are connected to said driver IC, and an area where said third electrodes are connected to said second electrode.

14. The liquid crystal device of claim 13, wherein said overcoat layer forms an insulating layer over said first electrode.

15. The liquid crystal device of claim 13, wherein said aluminum electrodes include terminal portions extending beyond said overcoat layer.

16. The liquid crystal device of claim 15, further comprising an anisotropic conductive film connecting said terminal portions and an external circuit connecting portions.

17. The liquid crystal device of claim 16, wherein said anisotropic conductive film overlaps part of the overcoat layer.

18. The liquid crystal device of claim 17, wherein an edge of said anisotropic conductive film abuts an edge of said overcoat layer.

19. The liquid crystal device of claim 13, wherein
   the electrodes formed on the protruding portion are aluminum electrodes.

20. A liquid crystal device comprising:
   a pair of substrates, each having an opposing face opposing each other with liquid crystal interposed therebetween, the opposing faces being provided with first and second electrodes;
   a protruding portion of one of said pair of substrates protruding relative to the other substrate;
   third electrodes formed on the protruding portion; said third electrodes electrically connected with said first and second electrodes; and
   an overcoat layer of a sol gel reacted inorganic substance covering the third electrodes.

* * * * *